United States Patent [19]

Bachman et al.

[11] 4,203,553
[45] May 20, 1980

[54] RIBBON BURNER

[75] Inventors: David L. Bachman, Lindley; Peter P. Bihuniak, Corning, both of N.Y.

[73] Assignee: Corning Glass Works, Corning, N.Y.

[21] Appl. No.: 810,055

[22] Filed: Jun. 27, 1977

[51] Int. Cl.² ............... F23D 13/40; F23D 15/00
[52] U.S. Cl. ................. 239/420; 239/288; 239/422; 239/424.5; 239/544; 239/549; 239/556
[58] Field of Search ............... 239/424.5, 556, 420, 239/544, 422, 543, 549, 288

[56] References Cited

U.S. PATENT DOCUMENTS

| | | | |
|---|---|---|---|
| 1,508,679 | 9/1924 | Dalrymple | 239/543 |
| 2,398,884 | 4/1946 | Crowe | 239/544 |
| 2,941,587 | 6/1960 | Hagy et al. | 239/424.5 |
| 3,565,346 | 2/1971 | Carrell | 239/422 |
| 3,942,723 | 3/1976 | Langdon | 239/543 |

FOREIGN PATENT DOCUMENTS 714517 11/1941 Fed. Rep. of Germany .......... 239/543
1052499 1/1954 France ........................... 239/544

*Primary Examiner*—Robert B. Reeves
*Assistant Examiner*—Michael J. Forman
*Attorney, Agent, or Firm*—William J. Simmons, Jr.; Walter S. Zebrowski; Clarence R. Patty, Jr.

[57] ABSTRACT

An elongated burner, which produces a stream of metal oxide soot, comprises three adjacent housings. A centrally disposed housing contains a linear array of orifices for issuing a gas-oxygen mixture to produce a linear flame. Disposed on opposite sides of the central housing are two housings having orifices for issuing into the flame two linear streams of metal halide vapor. Gaps between the central and outer housings permit air to be aspired for stabilizing the flame. Additional flame stabilization may be achieved by providing a shield along the entire perimeter of the halide vapor streams to prevent the random aspiration of air into the sides of the flame.

9 Claims, 8 Drawing Figures

RIBBON BURNER

BACKGROUND OF THE INVENTION

This invention relates to a burner for the production of a metal oxide article from a volatile compound containing a constituent of the oxide. More particularly, this invention relates to a ribbon burner capable of forming a linear deposit of such an oxide.

The formation of articles such as crucibles, tubing, optical waveguides and the like by depositing metal oxides produced by the flame hydrolysis process upon substrates or mandrels is well known. This process generally involves the vapor phase hydrolysis of volatile anhydrous chlorides of metallic elements from Groups III and IV of the Periodic System, such as for example, silicon tetrachloride, germanium tetrachloride, titanium tetrachloride and aluminum trichloride. U.S. Pat. Nos. 2,272,342; 3,609,829 and 3,737,392 teach methods of making various articles by employing this process. Generally, a single burner has been employed to deposit an oxide layer upon a mandrel or substrate. To coat a planar rectangular area the single burner can be caused to sequentially scan adjacent linear paths. To cover the outside surface of a cylindrical mandrel, the mandrel can be translated and rotated with respect to the flame from the burner as taught in U.S. Pat. No. 3,609,829. This latter mentioned patent teaches a burner for depositing pure fused silica ($SiO_2$). A stream of $SiCl_4$ issues from a centrally located aperture on a flat burner face. An annular slot surrounding the central aperture provides a stream of a dry, nonreactive gas such as oxygen or air. By "nonreactive gas" is meant one which does not react with the metal halide vapor at the temperatures at which the gas and vapor emanate from their orifices. If the nonreactive gas is oxygen, for example, it will react with the vapor in the high temperature reaction region of the flame which is remote from the burner face. An annular ring of apertures concentric with the central aperture and the annular slot provides a stream of a combustible gas. Since the oxygen issuing from the annular slot does not initially react with the $SiCl_4$, the $SiCl_4$ is not decomposed immediately adjacent the burner face, thereby preventing the accumulation of deposited obstructions in or around the apertures of the burner. The gaseous silicon tetrachloride does intermix and react with the oxygen and fuel a distance from the burner face, and the resultant reaction produces pure silicon dioxide to deposit upon the mandrel.

For many applications it is desirable to generate a uniform soot pattern with minimal movement between the work and the soot generating system. It may be desirable for example, to reduce translation induced striations caused by the employment of a single burner to scan the entire surface of the work. It may also be desirable to deposit a greater amount of soot per unit time than that which can be achieved by a single burner. A ribbon or strip burner appears to be the simplest soot generating system for providing large area coverage of the work.

An attempt was made to form a ribbon burner comprising a linear array of $SiCl_4$ delivery apertures, each surrounded by a narrow slot for providing that aperture with a sheath of shield oxygen, a linear array of fuel-supplying apertures being disposed on opposite sides of the array of annular slots. A burner of this type is disclosed in U.S. Pat. No. 3,565,346. Since each annular slot is formed by a tube disposed within an annular opening in the burner face, the tube cannot be secured to the burner face but must be secured only at that end thereof remote from the burner face. Since it was very difficult to maintain these tubes in a parallel array, the streams of $SiO_2$ particles generated by the reaction of the $SiCl_4$ gas issuing from each of the central apertures were directed to the mandrel in a nonuniform manner so that the thickness of the $SiO_2$ coating was nonuniform. Placing slotted supports within the apertures to maintain the tubes in a parallel array obstructed the flow of oxygen from the slots, thereby resulting in a buildup of $SiO_2$ on the burner face. It was noted that at low flows of inner shield oxygen, a well developed sheet-like stream of $SiO_2$ soot could be obtained. However, at such low flow rates of inner shield oxygen, a considerable amount of soot buildup occurred on the burner face between the inner shield tubes and the fuel apertures. If the inner shield flow was increased, this buildup was minimized, but the sheet-like nature of the soot stream was adversely affected. At these higher flows, the soot stream consisted of a series of closely spaced discrete streams rather than a continuous sheet.

To obtain a soot deposition of more uniform thickness the inner shield annular slots were replaced by two linear arrays of orifices, one on each side of the array of $SiCl_4$ vapor orifices and closely spaced with respect thereto. Two rows of gas-oxygen orifices are located outside the rows of shield gas orifices and are slightly inclined so that the flames therefrom converge a small distance from the face of the burner to establish a reaction zone. The inner shield oxygen is intended to impart a separation between the $SiCl_4$ vapor and the gas-oxygen reaction products. However, the relatively high velocity flow of oxygen from the inner shield orifices creates a low pressure area which draws a portion of the flame back toward the burner face and the vapor orifices, an occurrence referred to herein as backflaming. There is also a backward flow of soot particles along the interior surface of the gas-oxygen flames which causes a desposition on the cool face of the burner. Due to the number of manifolds that had to be formed in this burner and the number of arrays of orifices that were formed in the face thereof, this burner was difficult to construct and consequently very expensive.

SUMMARY OF THE INVENTION

It is therefore an object of the present invention to provide a ribbon burner which resists the buildup of soot on the face thereof during operation.

Another object is to provide a ribbon burner of simplified construction.

Briefly, the present invention relates to a burner for producing a flame in which a reactant gas undergoes a chemical reaction. The burner comprises at least one housing having means defining a first linear array of orifices for providing a plurality of streams of a combustible gas. The housing also includes means defining second and third parallel linear arrays of orifices for directing angled streams of the reactant gas which intersect the streams of combustible gas. The second and third arrays are disposed on opposite sides of the first array and are equally spaced therefrom.

DETAILED DESCRIPTION OF THE INVENTION

It is to be noted that the drawings are illustrative and symbolic of the invention, and there is no intention to indicate the scale or relative proportions of the elements shown therein.

Figure 1:
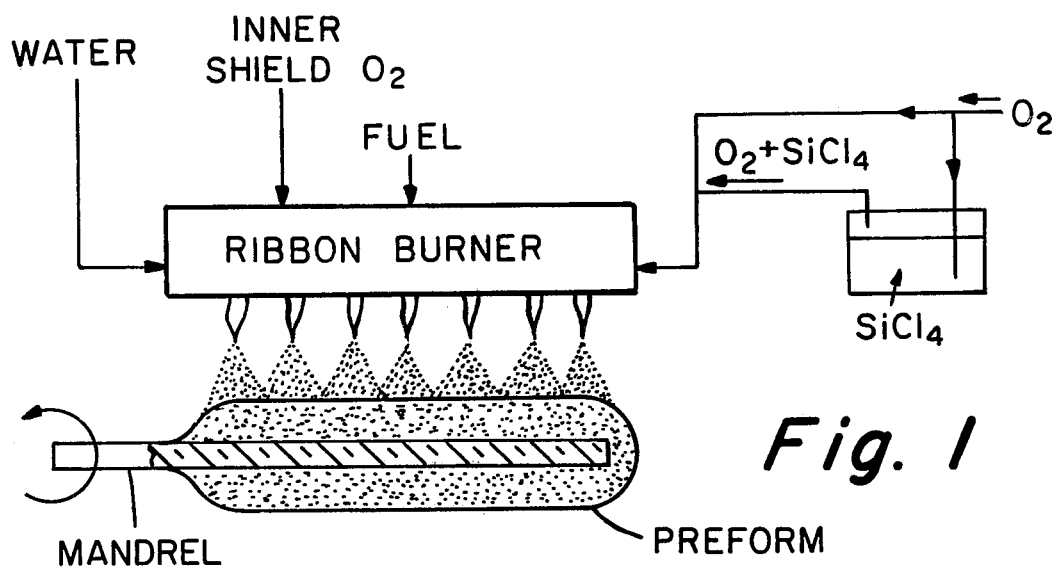
FIG. 1 is a schematic illustration of a system including a ribbon burner for forming an elongated soot preform.

FIG. 1 is a schematic diagram of a system for forming elongated soot preforms of the type which may be employed in the manufacture of optical waveguides. A stream of carrier gas, in this case oxygen, is introduced into and passes through the volatile silicon compound, in this case $SiCl_4$. The vapors of the volatile compound are entrained by the carrier gas and the mixture may be combined with additional oxygen before being conveyed to a ribbon burner wherein the vapors of the volatile compound are hydrolyzed and form silica particles in the flames of the burner.

As further illustrated in FIG. 1, a mandrel or support member, shown as a rod, is rotated as indicated by the arrow. Silica particles, sometimes referred to as soot, are deposited on the rotating mandrel to form a soot preform. After the preform has grown to a predetermined radius, it can be consolidated in a well-known manner to form a pure fused silica rod or tube. Prior to consolidation, the preform may be doped in accordance with the teachings of U.S. Pat. Nos. 3,859,073 or 3,864,113.

During the operation of the burner, a coolant such as water may be required to maintain the proper operating temperature. An inner shield gas such as oxygen may be discharged from orifices adjacent to those from which the oxygen and $SiCl_4$ is discharged to function as a barrier between the $SiCl_4$ and the products of combustion of the flame.

Figure 2:
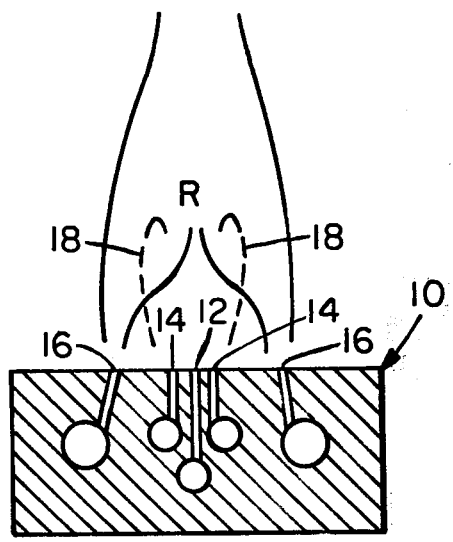
FIG. 2 is a cross-sectional view of a prior art type of burner, the operation thereof being illustrated.

For a better understanding of the problems encountered during the operation of previously employed burners, a prior art ribbon burner 10 is illustrated in FIG. 2. A linear array of orifices 12, which is centrally disposed on the face of burner 10, is provided for issuing a plurality of parallel streams of a reactant gas such as $SiCl_4$. Disposed on opposite sides of orifices 12 and equally spaced therefrom are two linear arrays of orifices 14 for issuing a dry, nonreactive inner shield gas such as oxygen or air. Streams of premixed gas and oxygen issue from linear arrays of orifices 16 which are equally spaced on opposite sides of orifices 12. Orifices 16 are slanted so that the gas-oxygen flames converge at a small distance from the face of the burner to establish a reaction zone R. The inner shield gas issuing from orifices 14 prevents the hydrolysis reaction from occurring at the burner face by providing a barrier between the products of combustion of the gas-oxygen flame and the $SiCl_4$ vapor issuing from orifices 12. This inner shield establishes the reaction zone R at a distance beyond the burner face and also confines the reaction and provides direction to the generated soot.

During the operation of the prior art burner of FIG. 2 there was a backward flow of soot particles from reaction zone R along the interior surface of the flame as illustrated by broken lines 18. These soot particles caused a deposit on the face of the burner which interfered with the proper flow of gas from the orifices and eventually plugged the orifices, thereby necessitating shut-down.

Figure 3:
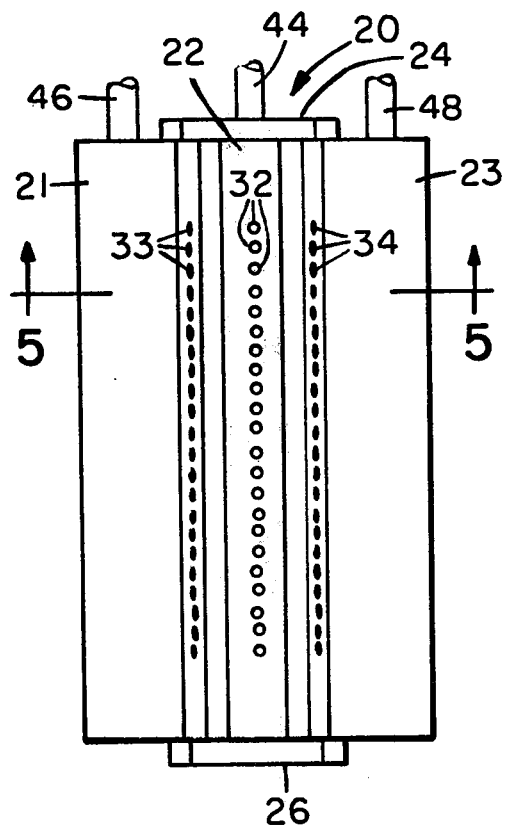
FIGS. 3 and 4 are plan and side elevational views, respectively, of a burner constructed in accordance with the teachings of the present invention.
Figure 4:
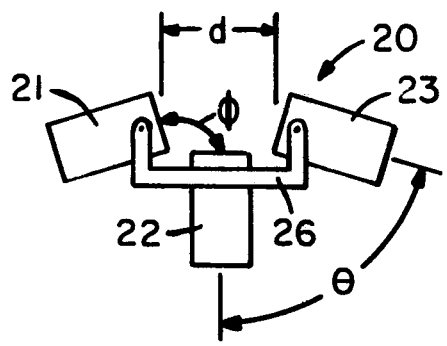
Figure 5:
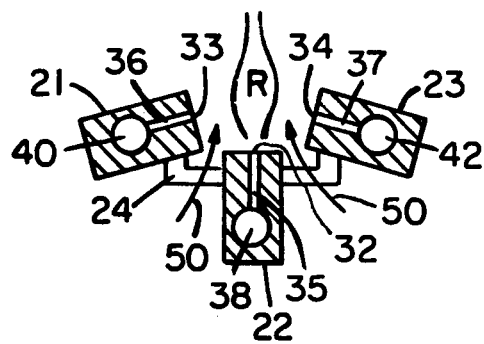
FIG. 5 is a cross-sectional view taken along lines 5—5 of FIG. 3.

A burner design which eliminates the soot buildup problem discussed hereinabove is illustrated in FIGS. 3-5. Burner 20 consists of three housings 21, 22 and 23 which are attached to a pair of mounting brackets 24 and 26. A linear array of orifices 32, from which a combustible gas such as a mixture of fuel gas and oxygen emanates, is disposed along a surface of housing 22. Linear arrays of orifices 33 and 34, which are disposed in the adjacent surfaces of housings 21 and 23, respectively, supply streams of a vapor such as $SiCl_4$ which can be hydrolyzed in the flame resulting from combustion of the gas issuing from orifices 32 to provide a metal oxide soot such as $SiO_2$. Orifices 32, 33 and 34 are connected by apertures 35, 36 and 37, respectively, to manifolds 38, 40 and 42, respectively, to which external pipes 44, 46 and 48, respectively, are connected. Whereas each of the arrays of orifices 32, 33 and 34 has been illustrated as consisting of a single row of orifices, they may consist of a plurality of closely spaced, parallel rows of orifices.

Figure 6:
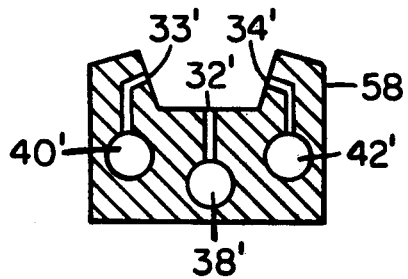
FIG. 6 is a cross-sectional view of another embodiment of the present invention.

Housings 21 and 23 can be pivotally mounted on the brackets to provide angular adjustment thereof. In an oxide deposition system wherein the angular orientation of the housings is fixed, all of the housings can be fixedly mounted on the brackets by any well-known means such as welding. Moreover, as illustrated in FIG. 6, wherein elements similar to those of FIG. 5 are represented by primed reference numerals, a single housing 58 could be employed. The embodiment of FIG. 6 contains no means for providing aspired air immediately adjacent to the sides of the flame, whereas the separate housings of FIG. 5 are separated by gaps through which air can flow as indicated by arrows 50.

Figure 7:
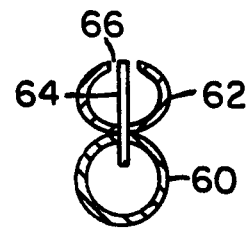
FIG. 7 is a cross-sectional view of a burner unit which can be employed to provide a surface-mixed flame.

Housing 22 could be replaced by a burner of the type illustrated in FIG. 7 to provide a surface-mixed flame. In the cross-sectional view of FIG. 7, tubular manifolds 60 and 62 are secured together. A linear array of apertures is disposed along that surface of manifold 72 opposite manifold 60. Disposed in each aperture is a tube 64 which extends through the contacting walls of manifolds 60 and 62. Tubes 64 are smaller in diameter than the apertures in manifold 62 so that an end of each tube 64 is surrounded by an annular slot 66. Fuel gas and oxygen may be supplied to manifolds 60 and 62, respectively. The oxygen emanating from slot 66 and gas emanating from tube 64 become mixed near the surface of manifold 62.

Figure 8:
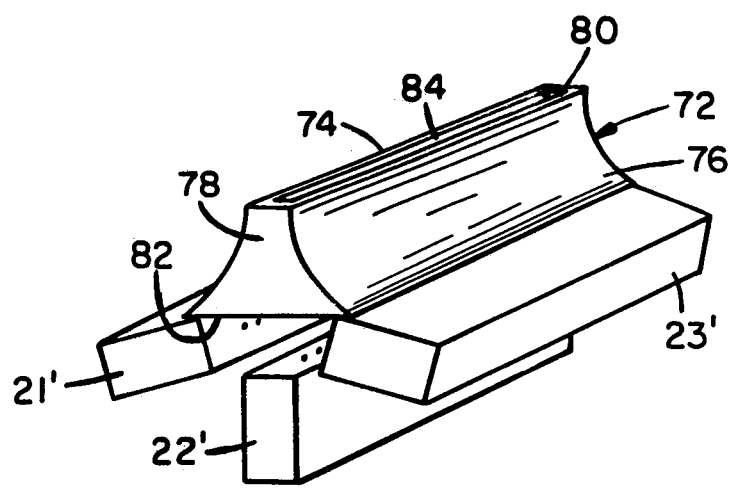
FIG. 8 is an oblique view of a linear burner having a shield.

As shown in FIG. 8, wherein elements similar to those of FIGS. 3-5 are represented by primed reference numerals, a shield 72 may be employed to provide direction to the flame and to prevent the random aspiration of air into the sides of the flame, thereby stabilizing the flame. Shield 72 comprises two elongated sidewalls 74 and 76 and two end walls 78 and 80. Sidewalls 74 and 76 are curved to provide a large opening 82 adjacent to the housings, the spacing between walls 74 and 76 gradually decreasing to provide an elongated, narrow slot 82 from which the flame and oxide soot emerge. The edges of sidewalls 74 and 76 may contact the housings adjacent thereto, or they may be spaced therefrom to provide a gap of predetermined size for the purpose of causing a predetermined amount of air to be aspirated into the flame.

As indicated hereinabove, backpressure caused by the linear intersecting flames of the prior art burner of FIG. 2 causes the optimum operation of that burner to be dependent upon the relative spacings and angular orientations of orifice apertures, flow rates and the like. However, no adjustment of these variables completely eliminated the soot buildup problem that was caused by such backpressure. Since the burner of the present invention employs a single, centrally-located burner, no backpressure is generated, and soot buildup on the burner face can be completely eliminated.

Referring to FIGS. 4 and 5, the axes of apertures 36 and 37 are disposed at an angle $\theta$ with respect to the axes of apertures 35. Since all of these apertures are perpendicular to the faces of the housings at which orifices 32, 33 and 34 are defined, the face of housing 22 is disposed at an angle $\phi$ with respect to the faces of housings 21 and 23 wherein the angle $\phi$ is the complement of the angle $\theta$. As shown in FIG. 5, a reaction zone R is established in the flame in the vicinity of the intersection of the streams of reactant gas that issue from orifices 33 and 34. The distance between the face of housing 22 and reaction zone R is determined by the angle $\theta$ and the distance d between arrays of orifices 33 and 34. Although the mandrel or target may be located at zone R, it is preferably located beyond zone R to permit the reactant gas to more completely react prior to impinging thereon. For example, if the distance d is 50 mm, the angle $\theta$ could be between 14° and 90° to cause adequate reaction to occur when the mandrel is located 102 mm from the face of housing 22. If the distance d were only 10 mm, which is about the smallest distance that could be practically achieved, the angle $\theta$ could be between 3° and 90°. If the angle $\theta$ were less than about 3° the reactant gas insufficiently mixes with the flame, thereby resulting in an incomplete reaction. The flame is excessively disturbed by the reactant gas when the angle $\theta$ exceeds 90°. The preferred range for $\theta$ is between about 90° and 30°. From the above conditions, it can be seen that the angle $\theta$ can be between about 90° and 177° and is preferably between about 90° and 150°.

Following is a specific example of a burner constructed in accordance with the present invention. Three housings were disposed as shown in FIG. 4, wherein the angle $\theta$ was 90° and the distance d was about 29 mm. The width of the rectangular faces of housings 21, 22 and 23 was 10 mm, and the distance from the face of housing 22 to a plane passing through orifices 33 and 34 was about 8 mm. Arrays of orifices 33 and 34 each consisted of a single array of 97 orifices. Housing 22, however, had two parallel arrays of orifices 32, each such array also comprising 97 orifices. Each of the orifices 32, 33 and 34 had a diameter of 0.6 mm. The length of each array was 15.3 cm.

The bubbler system was similar to that illustrated in FIG. 1. Oxygen flowed at a rate of 2000 ccpm through a bubbler containing SiCl$_4$ which was maintained at a temperature of 35° C. The oxygen and SiCl$_4$ vapor flowing from the bubbler was mixed with bypass oxygen supplied at a rate of 200 ccpm, and the resultant mixture was fed in equal portions to manifolds 40 and 42. Gas and oxygen were fed to manifold 38 at the rate of 1250 ccpm and 750 ccpm, respectively. A shield of the type illustrated in FIG. 8 was employed. The aforementioned specifications caused the reaction zone R to begin at about 8 mm from the face of housing 22. To ensure complete reaction of the SiCl$_4$, the mandrel at which the soot was directed was disposed about 10.2 cm from the face of housing 22. A linear deposit of SiO$_2$ soot occurred at the mandrel without soot buildup occurring on the burner face.

We claim:

1. A burner for producing a flame in which a metal halide vapor undergoes a chemical reaction resulting in the formation of metal oxide particles, said burner comprising first, second and third housings, said first housing being symmetrically disposed between said second and third housings, said first, second and third housings having first, second and third elongated rectangular faces, respectively, each of said first, second and third faces having first and second elongated edges, the first edge of said first rectangular face being disposed adjacent to the first edge of said second rectangular face and the second edge of said first rectangular face being disposed adjacent to the first edge of said third rectangular face, said second and third rectangular faces making equal angles $\phi$ with said first rectangular face, wherein $90° \leq \phi \leq 177°$, first, second and third rows of apertures in said first, second and third housings, respectively, said apertures forming first, second and third linear arrays of apertures in said first, second and third faces, respectively, said first array of orifices being centrally disposed lengthwise along said first face, and said second and third arrays of orifices being disposed along said second and third faces, respectively, said first array being equally spaced from said second and third arrays, means within said first housing defining a first manifold for receiving a supply of combustible gas, said first manifold communicating with said first row of apertures and supplying the same with said combustible gas, whereby a first plurality of streams of combustible gas issue from said first row of apertures, means within said second and third housings defining second and third manifolds, respectively, for receiving a supply of said metal halide vapor, said second and third manifolds communicating with said second and third rows of apertures, respectively, and supplying the same with said vapor, whereby second and third pluralities of streams of said vapor issue from said second and third rows of apertures, respectively, said second and third pluralities of streams intersecting said plurality of streams of combustible gas, and means for supporting said first, second and third housings.

2. A burner in accordance with claim 1 wherein said second and third housings are pivotally mounted on said support means.

3. A burner in accordance with claim 1 wherein said apertures are perpendicular to the faces of their respective housings.

4. A burner in accordance with claim 1 wherein said first housing is spaced from said second and third housings to provide gaps therebetween.

5. A burner in accordance with claim 1 further comprising a shield having first and second elongated curved sidewalls which are symmetrically disposed with respect to a plane passing through the centers of said first row of apertures.

6. A burner in accordance with claim 5 wherein said first and second sidewalls contact said second and third housings, respectively.

7. A burner in accordance with claim 5 wherein said first and second sidewalls are adjacent to and spaced from said second and third housings, respectively.

8. A burner for producing a flame in which a reactant gas undergoes a chemical reaction whereby soot particles of an oxide of a constituent of said reactant gas are formed, said burner comprising first, second and third burner housings having first, second and third elongated rectangular faces, respectively, means in said first housing defining a first linear array of orifices for providing a plurality of streams of a combustible gas, said first array of orifices being centrally disposed lengthwise along said first face, means in said second and third housings respectively defining second and third parallel linear arrays of orifices for directing angled streams of said reactant gas which intersect the streams of combustible gas, said second and third arrays of orifices being disposed along said second and third faces, operatively, each of said first, second and third faces having first and second elongated edges, said first housing being symmetrically disposed between said second and third housings, the first edge of said first rectangular face being disposed adjacent to the first edge of said second rectangular face and the second edge of said first rectangular face being disposed adjacent to the first edge of said third rectangular face, said second and third rectangular faces making equal angles $\phi$ with said first rectangular face, wherein $90° \leq \phi \leq 177°$, said second and third arrays being disposed on opposite sides of said first array and being equally spaced therefrom, whereby said oxide particles are directed away from said burner face and soot buildup on the burner face is eliminated.

9. A burner in accordance with claim 8 wherein said first housing is spaced from said second and third housings to provide gaps therebetween.

* * * * *